US010122345B2

(12) United States Patent
Edrees et al.

(10) Patent No.: US 10,122,345 B2
(45) Date of Patent: Nov. 6, 2018

(54) CO-INTEGRATED BULK ACOUSTIC WAVE RESONATORS

(71) Applicant: The Trustees of Columbia University in the City of New York, New York, NY (US)

(72) Inventors: Hassan Edrees, New York, NY (US); Ioannis Kymissis, New York, NY (US); Peter Kinget, Summitt, NJ (US)

(73) Assignee: The Trustees of Columbia University in the City of New York, New York, NY (US)

( * ) Notice: Subject to any disclaimer, the term of this patent is extended or adjusted under 35 U.S.C. 154(b) by 204 days.

(21) Appl. No.: 14/392,126

(22) PCT Filed: Jun. 26, 2014

(86) PCT No.: PCT/US2014/044335
§ 371 (c)(1),
(2) Date: Dec. 23, 2015

(87) PCT Pub. No.: WO2014/210307
PCT Pub. Date: Dec. 31, 2014

(65) Prior Publication Data
US 2016/0191017 A1 Jun. 30, 2016

Related U.S. Application Data

(60) Provisional application No. 61/839,715, filed on Jun. 26, 2013.

(51) Int. Cl.
H03H 9/54 (2006.01)
H01L 27/20 (2006.01)
(Continued)

(52) U.S. Cl.
CPC ............ H03H 11/04 (2013.01); H01L 27/20 (2013.01); H01L 41/081 (2013.01);
(Continued)

(58) Field of Classification Search
CPC .......... H03H 9/17; H03H 9/205; H03H 9/467; H03H 9/545; H03H 9/605; H03H 11/04;
(Continued)

(56) References Cited

U.S. PATENT DOCUMENTS 5,872,493 A 2/1999 Ella
6,809,604 B2 10/2004 Kawakubo
(Continued)

FOREIGN PATENT DOCUMENTS

CN 1449110 A 10/2003
CN 1652458 A 8/2005
(Continued)

OTHER PUBLICATIONS

E.R. Crespin et al.; "Fully Integrated Switchable Filter Banks"; published in 2012 IEEE MTT-S International Microwave Symposium Digest (MTT), Conference date Jun. 17-22, 2012, added to IEEE Xplore on Aug. 6, 2012, 3 pages and 1 page IEEE Xplore abstract.*

(Continued)

Primary Examiner — Barbara Summons
(74) Attorney, Agent, or Firm — Schwegman Lundberg & Woessner, P.A.

(57) ABSTRACT

An electrical circuit assembly can include a semiconductor integrated circuit, such as fabricated including CMOS devices. A first lateral-mode resonator can be fabricated upon a surface of the semiconductor integrated circuit, such as including a deposited acoustic energy storage layer including a semiconductor material, a deposited piezoelectric layer acoustically coupled to the deposited acoustic (Continued)

US 10,122,345 B2
Page 2 energy storage layer, and a first conductive region electrically coupled to the deposited piezoelectric layer and electrically coupled to the semiconductor integrated circuit. The semiconductor integrated circuit can include one or more transistor structures, such as fabricated prior to fabrication of the lateral-mode resonator. Fabrication of the lateral-mode resonator can include low-temperature processing specified to avoid disrupting operational characteristics of the transistor structures.

23 Claims, 9 Drawing Sheets

(51) Int. Cl.
| | |
|---|---|
| H03H 11/04 | (2006.01) |
| H03H 9/05 | (2006.01) |
| H03H 9/24 | (2006.01) |
| H03H 9/46 | (2006.01) |
| H03H 9/52 | (2006.01) |
| H01L 41/08 | (2006.01) |
| H03H 9/60 | (2006.01) |
| H03H 9/17 | (2006.01) |
| H03H 9/205 | (2006.01) |
| H03H 9/02 | (2006.01) |

(52) U.S. Cl.
CPC ............ *H03H 9/0547* (2013.01); *H03H 9/17* (2013.01); *H03H 9/205* (2013.01); *H03H 9/2426* (2013.01); *H03H 9/465* (2013.01); *H03H 9/467* (2013.01); *H03H 9/525* (2013.01); *H03H 9/545* (2013.01); *H03H 9/605* (2013.01); *H03H 2009/02188* (2013.01); *H03H 2009/02496* (2013.01)

(58) Field of Classification Search
CPC ..... H03H 2009/02188; H03H 9/02244; H03H 9/02259; H03H 9/0538; H03H 9/0547; H03H 2009/02496; H03H 9/173; H03H 9/175; H03H 9/2405; H03H 2009/241; H03H 9/2426; H03H 9/525; H03H 9/462; H03H 9/465; H01L 27/20; H01L 41/081; H01L 41/09; H01L 41/0986
USPC ................. 333/133, 186, 187, 189, 193, 195
See application file for complete search history.

(56) References Cited

U.S. PATENT DOCUMENTS

| | | | |
|---|---|---|---|
| 6,909,221 B2* | 6/2005 | Ayazi | H03H 3/02 310/312 |
| 7,221,242 B2 | 5/2007 | Asai et al. | |
| 7,323,805 B2 | 1/2008 | Sano et al. | |
| 7,385,334 B1* | 6/2008 | Olsson | H03H 3/0072 310/309 |
| 7,514,760 B1* | 4/2009 | Quevy | B81C 1/00246 257/414 |
| 7,767,484 B2* | 8/2010 | Ayazi | B81C 1/00476 257/E21.613 |
| 7,800,282 B2* | 9/2010 | Ayazi | H03B 5/326 310/316.01 |
| 8,367,305 B1 | 2/2013 | Wojciechowski et al. | |
| 8,497,747 B1* | 7/2013 | Wojciechowski | H03H 9/0095 310/366 |
| 8,525,619 B1 | 9/2013 | Olsson et al. | |
| 9,154,107 B2* | 10/2015 | Adam | H03H 9/02078 |
| 9,276,556 B1* | 3/2016 | Wu | H03H 9/462 |
| 2001/0030489 A1 | 10/2001 | Nguyen | |
| 2003/0015941 A1 | 1/2003 | Nakatani et al. | |
| 2003/0199105 A1 | 10/2003 | Kub et al. | |
| 2004/0135144 A1 | 7/2004 | Yamada et al. | |
| 2006/0125489 A1 | 6/2006 | Feucht et al. | |
| 2006/0137453 A1 | 6/2006 | Wu et al. | |
| 2006/0185139 A1 | 8/2006 | Larson, III et al. | |
| 2006/0202779 A1 | 9/2006 | Fazzio et al. | |
| 2006/0214747 A1 | 9/2006 | Lakin | |
| 2006/0290449 A1* | 12/2006 | Piazza | H03H 3/02 333/187 |
| 2007/0007851 A1 | 1/2007 | Loebl et al. | |
| 2007/0210349 A1 | 9/2007 | Lu et al. | |
| 2007/0238213 A1 | 10/2007 | Yamaguchi et al. | |
| 2010/0066467 A1* | 3/2010 | Ayazi | H03H 9/172 333/187 |
| 2010/0156566 A1 | 6/2010 | Abdolvand et al. | |
| 2011/0111545 A1 | 5/2011 | El-gamal | |
| 2012/0081195 A1* | 4/2012 | Adam | H03H 9/02078 333/187 |
| 2012/0164753 A1 | 6/2012 | Johnston et al. | |

FOREIGN PATENT DOCUMENTS

| | | |
|---|---|---|
| CN | 20060125489 A1 | 6/2006 |
| CN | 101246162 A | 8/2008 |
| EP | 1959568 A1 | 8/2008 |
| WO | WO-0068419 A2 | 11/2000 |
| WO | WO-2008101646 A1 | 8/2008 |
| WO | WO-2010127122 A1 | 11/2010 |
| WO | WO-2014210307 A1 | 12/2014 |

OTHER PUBLICATIONS

M. Ziaei-Moayyed et al.; "Silicon Carbide Lateral Overtone Bulk Acoustic Resonator With Ultrahigh Quality Factor"; 2011 IEEE, MEMS 2011, Cancun, Mexico, Jan. 23-27, 2011, pp. 788-792.*
K.E. Wojciechowski et al.; "Single-Chip Precision Oscillators Based on Multi-Frequency, High-Q Aluminum Nitride MEMS Resonators"; 2009 IEEE, Transducers 2009, Denver, CO, USA, Jun. 21-25, 2009.*
R.H. Olsson III et al.; "VHF and UHF Mechanically Coupled Aluminum Nitride MEMS Filters"; published in 2008 IEEE International Frequency Control Symposium, Conference date May 19-21, 2008, added to IEEE Xplore on Sep. 9, 2008, pp. 634-639 and 1 page IEEE Xplore abstract.*
F. Nabki et al.; "Frequency Tunable Silicon Carbide Resonators for MEMS Above IC"; IEEE 2008 Custom Integrated Circuits Conference (CICC), 2008, pp. 185-188.*
"Chinese Application Serial No. 201080018971.9, Argument and Amendment filed Jun. 4, 2014 in response to Office Action dated Mar. 20, 2014", (w/ English Translation of Claims), 12 pgs.
"International Application Serial No. PCT/US2014/044335, International Preliminary Report on Patentability dated Jan. 7, 2016", 11 pgs.
Aberg, Markku, et al., "A low noise 0.9 GHz FBAR clock", *Analog Integ. Circ. Sig. Proc.*, 50, ((2007), 29-37.
Augustyniak, M., et al., "An Integrated Gravimetric FBAR Circuit for Operation in Liquids Using a Flip-Chip Extended 0.13μm CMOS Technology", *IEEE International Solid-State Circuits Conference. 2007. ISSCC 2007. Digest of Technical Papers*, (Feb. 2007), 392-393.
Chee, Y. H., et al., "A sub-100μW 1.9-GHz CMOS Oscillator Using FBAR Resonator", *2005 IEEE Radio Frequency integrated Circuits (RFIC) Symposium*, (2005), 123-126.
Dubois, Marc-Alexandre, et al., "Integration of High-Q BAW Resonators and Filters Above IC", *2005 IEEE International Solid-State Circuits Conference 2005. Digest of Technical Papers. ISSCC*, (Feb. 2005), 392-393.
Gabl, R., et al., "Novel Integrated FBAR Sensors: a Universal Technology Platform for Bio-Sensors and Gas-Detection", *Proceedings of IEEE Sensors, 2003*, (Oct. 2003), 1184-1188.
Leeson, D. B., et al., "A Simple Model of Feedback Oscillator Noise Spectrum", *Proceedings of the IEEE*, vol. 54, issue 2, (Feb. 1966), 329-330.
Muratsugu, Makoto, et al., "Quartz crystal microbalance for the Detection of Microgram Quantities of Human Serum Albumin:Relation-

(56) References Cited

OTHER PUBLICATIONS ship between theFrequency Change and the Mass of Protein Adsorbed", *Analytical Chemistry*, 65(20), (1993), 2933-2937.
Otis, B. P., et al., "A 300-μW 1.9-GHz CMOS oscillator utilizing micromachined resonators", *IEEE Journal of Solid-State Circuits*, 38(7), (Jul. 2003), 1271-1274.
U.S. Appl. No. 13/283,670, Non Final Office Action dated Jun. 24, 2014, 10 pgs.
U.S. Appl. No. 13/283,670, Response filed Apr. 30, 2014 to Restriction Requirement dated Jan. 30, 2014, 8 pgs.
U.S. Appl. No. 13/283,670, Restriction Requirement dated Jan. 30, 2014, 9 pgs.
Canadian Application Serial No. 2,760,508, Amendment dated Oct. 28, 2011, 6 pgs.
Canadian Application Serial No. 2,760,508, Office Action dated Feb. 14, 2013, 2 pgs.
Canadian Application Serial No. 2,760,508, Response filed Aug. 14, 2013 to Office Action dated Feb. 14, 2013, 14 pgs.
Chinese Application Serial No. 201080018971.9, Office Action dated Mar. 20, 2014, w/English translation, 6 pgs.
Chinese Application Serial No. 201080018971.9, Office Action dated Jun. 19, 2014, w/English translation, 17 pgs.
Chinese Application Serial No. 201080018971.9, Office Action dated Jul. 2, 2013, w/English translation, 18 pgs.
Chinese Application Serial No. 201080018971.9, Office Action dated Dec. 5, 2013, w/English translation, 19 pgs.
Chinese Application Serial No. 201080018971.9, Response filed Feb. 20, 2014 to Office Action dated Dec. 5, 2013, w/English claims, 11 pgs.
Chinese Application Serial No. 201080018971.9, Response filed Nov. 18, 2013 to Office Action dated Jul. 2, 2013, w/English claims, 10 pgs.
European Application Serial No. 10770334.0, Extended European Search Report dated Apr. 24, 2014, 6 pgs.
International Application Serial No. PCT/US10/32976, Search Report dated Aug. 4, 2010, 8 pgs.
International Application Serial No. PCT/US10/32976, Written Opinion dated Aug. 4, 2010, 8 pgs.
International Application Serial No. PCT/US2010/032976, Preliminary Report on Patentability dated Nov. 10, 2011, 7 pgs.
International Application Serial No. PCT/US2014/044335, International Search Report dated Oct. 30, 2014, 2 pgs.
International Application Serial No. PCT/US2014/044335, Written Opinion dated Oct. 30, 2014, 9 pgs.
Abdolvand, Reza, et al., "ZNO-on-nanocrystalline diamond lateral bulk acoustic resonators", IEEE 20th International Conference on Micro Electro Mechanical Systems, 2007 . MEMS., (2007), 795-798.
Brederlow R., et al., "Biochemical sensors based on bulk acoustic wave resonators", IEEE International Electron Devices Meeting, 2003. IEDM '03 Technical Digest., (2003), 32.7.1-32.7.3.
Clark, J. R, et al., "High-Q VHF micromechanical contour-mode disk resonators", Technical Digest. International Electron Devices Meeting, 2000. IEDM '00., (2000), 493-496.
Gabl, R, et al., "First results on label-free detection of DNA and protein molecules using a novel integrated sensor technology based on gravimetric detection principles", Biosensors and Bioelectronics, 19(6), (Jan. 15, 2004), 615-620.
Giner, J., et al., "A fully integrated programmable dual-band RF filter based on electrically and mechanically coupled CMOS-MEMS resonators", Journal of Micromechanics and Microengineering, 22(5), (2012), 055020.
Jin, Pengcheng, et al., "Processing chip for thin film bulk acoustic resonator mass sensor", Journal of Control Science and Engineering, 2012, (Jan. 2012), Article ID 923617, 5 pages.
Johnston, Matthew L., et al., "FBAR-CMOS Oscillator Array for Mass-Sensing Applications", IEEE Sensors Journal, vol. 10, No. 6, (Jun. 2010), 1042-1047.
Lee, Jae Bin, et al., "Deposition of ZnO thin films by magnetron sputtering for a film bulk acoustic resonator", Thin Solid Films, 435(1-2), (Jul. 1, 2003), 179-185.
Lee, Vincent W., "Advanced Integration of Devices Enabled by Laser Crystallization of Silicon", doctoral dissertation, Columbia University, (2012), 123 pgs.
Nguyen, Clark T.-C, et al., "An integrated CMOS micromechanical resonator high-Q oscillator", IEEE Journal of Solid-State Circuits, 34(4), (Apr. 1999), 440-455.
Otis, Brian P, et al., "A 300μW 1.9GHz CMOS Oscillator Utilizing Micromachined Resonators", Proceedings of the 28th European Solid-State Circuits Conference, 2002. ESSCIRC 2002., (2002), 151-154.
Piazza, G., "MEMS Resonators for Frequency Control and Sensing Applications", [Online]. Retrieved from the Internet: <URL: http://www.ifcs-eftf2011.org/sites/ifcs-eftf2011.org/files/editor-files/Slides_Piazza.pdf>, (Accessed Apr. 30, 2014), 104 pgs.
Rinaldi, M., et al., "AIN contour-mode resonators for narrow-band filters above 3 GHz", IEEE International Frequency Control Symposium, 2009 Joint with the 22nd European Frequency and Time Forum., (2009), 70-74.
Staszewski, R. B, et al., "A first RF digitally-controlled oscillator for mobile phones", 2005 IEEE Radio Frequency integrated Circuits (RFIC) Symposium, 2005. Digest of Papers., (2005), 119-122.

\* cited by examiner

CO-INTEGRATED BULK ACOUSTIC WAVE RESONATORS

CLAIM OF PRIORITY

This patent application is a U.S. National Stage Filing under 35 U.S.C. 371 from International Application No. PCT/US2014/044335, filed on Jun. 26, 2014, and published as WO 2014/210307 A1 on Dec. 31, 2014, which claims the benefit of priority of Kinget et al., U.S. Provisional Patent Application Ser. No. 61/839,715 entitled "ON-TOP-OF-CMOS BULK ACOUSTIC WAVE RESONATORS FOR RF APPLICATIONS," filed on Jun. 26, 2013, which are hereby incorporated by reference herein in their entireties.

BACKGROUND

U.S. Pat. Pub. No. US 2012/0164753, titled "MONOLITHIC FBAR-CMOS STRUCTURE SUCH AS FOR MASS SENSING," published on Jun. 28, 2012, is directed toward an apparatus that comprises a thin-film bulk acoustic resonator such as can include an acoustic mirror, a piezoelectric region acoustically coupled to the acoustic mirror, and first and second conductors that can be electrically coupled to the piezoelectric region, and applications thereof.

SUMMARY

An electrical circuit assembly can include a semiconductor integrated circuit, such as fabricated including complementary metal-oxide-semiconductor (CMOS) devices. A first lateral-mode resonator can be fabricated upon a surface of the semiconductor integrated circuit, such as including a deposited acoustic energy storage layer including a semiconductor material, a deposited piezoelectric layer acoustically coupled to the deposited acoustic energy storage layer, and a first conductive region electrically coupled to the deposited piezoelectric layer and electrically coupled to the semiconductor integrated circuit. The semiconductor integrated circuit can include one or more transistor structures, such as fabricated prior to fabrication of the lateral-mode resonator. Fabrication of the lateral-mode resonator can include low-temperature processing specified to avoid disrupting operational characteristics of the prior-fabricated transistor structures. In an example, such low-temperature processing can include a recrystallization technique, such as to provide the acoustic energy storage layer of a lateral-mode resonator. The recrystallization technique can include use of a laser during fabrication.

An array of resonators can be formed, such as to provide a co-integrated circuit including one or more lateral-mode resonators and transistor structures on a commonly-shared semiconductor integrate circuit substrate, without requiring use of wirebonds between the resonators and other circuitry. Lateral dimensions of respective lateral-mode resonators can be varied such as to establish different specified operating characteristics of the resonators, such as resonant frequency or impedance. One or more of the lateral-mode oscillators can be configured as a lateral overtone bulk acoustic wave resonator (LOBAR). Applications for such an array of lateral-mode resonators co-integrated with other circuitry can include switchable filter circuits for communications applications, such as to provide highly-integrated RF signal chains for frequency-agile radio, including channel aggregation capability.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

"Cognitive Radio" can generally represent a paradigm shift for wireless communications that can be aimed at overcoming existing spectrum utilization efficiency challenges. Spectral occupancy studies generally illustrate that assigning fixed uses for the spectrum can lead to extreme crowding in some bands and significant underutilization in other areas. The cognitive radio paradigm can make possible the opportunistic use of one or more of available spectral resources, access resources, or devices. For example, instead of assigning particular frequency bands once-and-forever for fixed uses, in cognitive radio the mobile terminals can assess the spectrum usage in their specific location at the given time and dynamically access the available spectrum with the appropriate access technology (e.g., corresponding to one or more wireless standards such as Long Term Evolution (LTE), or one or more standards in the IEEE 802.11 family ("WiFi") or 802.16 (WiMax) family, as examples). This sort of dynamic sharing of spectrum can significantly alleviate the spectrum scarcity problem while respecting the rights of the spectrum incumbents.

Access terminals in a shared spectrum application may need to handle substantial in-band interference from other users. In traditional approaches to RF transceiver architectures and circuit design solutions the in-band interference between users is managed very carefully in the standard specifications or with dynamic power control under the supervision of a base station. Such solutions generally cannot handle the substantial interference levels in cognitive radio systems without an unacceptable increase in power dissipation.

The present inventors have recognized, among other things, that the use of reconfigurable bulk acoustic wave (BAW) filter arrays can provide performance suitable for a cognitive radio scheme. For example, such filter arrays can be located between an antenna and a terminal's receiver electronics.

Figure 6:
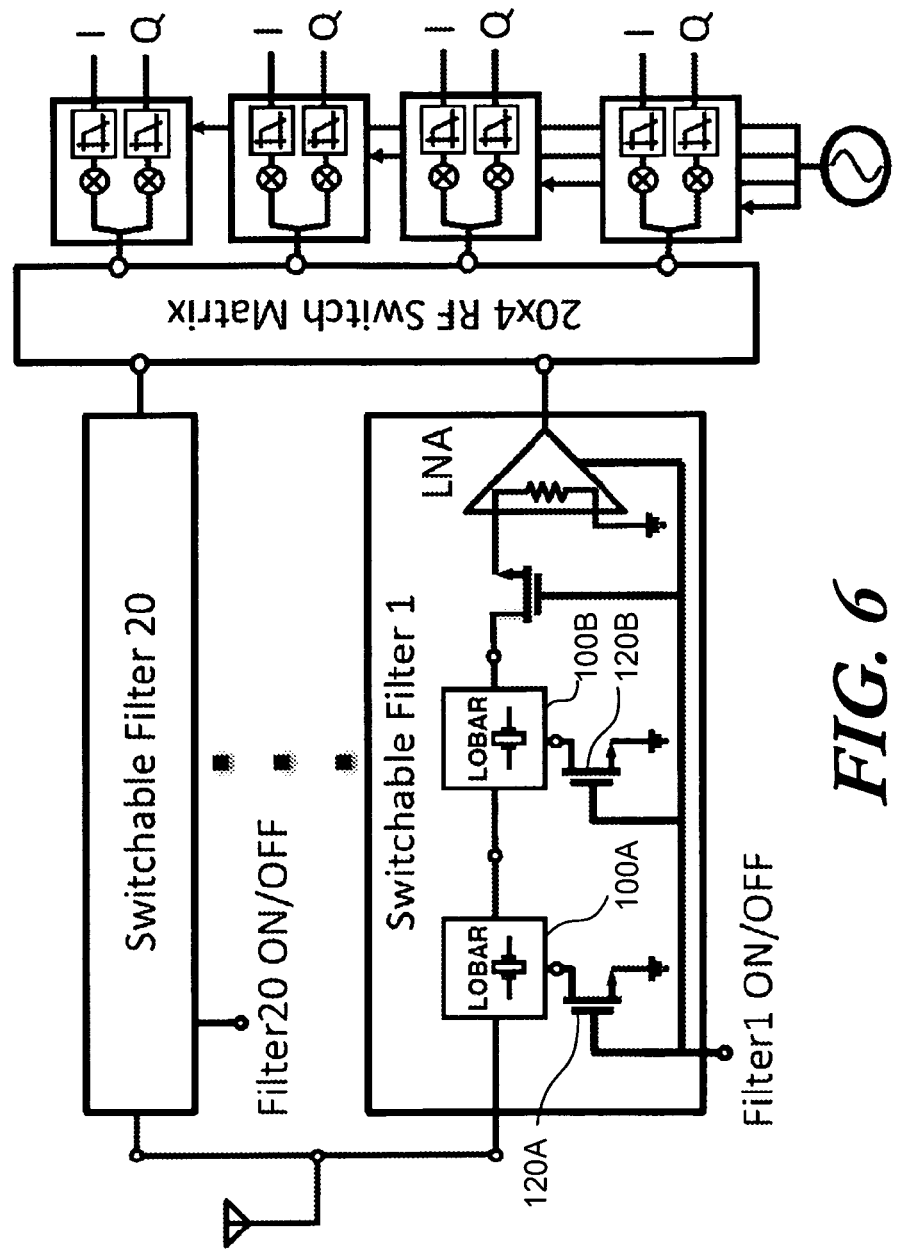
FIG. 6 illustrates generally an example of a radio architecture that can include an array of filters selectively coupleable to an antenna, where the filters can include lateral-mode resonators.

Unique BAW filter technology can be used, such as can enable the holistic design of interference tolerant, re-configurable receiver circuit architectures such as for contiguous and non-contiguous bandwidth (channel) aggregation. Such a BAW filter can include one or more lateral-mode resonant filters, such as fabricated upon a semiconductor integrated circuit (e.g., upon a semiconductor integrated circuit having complementary metal-oxide-semiconductor (CMOS) devices). FIG. 6 shows an illustrative example of an RF receiver front-end circuit with a the switchable filter.

In one approach to rejecting out-of-band (OOB) interferers, radio receivers in mobile terminals can use a bank of discrete front-end filters (e.g., surface acoustic wave (SAW) or BAW) that can each be tuned to a single application band, e.g. a band established to conform to a channel allocation in one or more wireless standards, such as can include GSM850, PCS1900, LTE, or WiFi, for example. Such channels generally have bandwidths of roughly 20 to 60 MHz. These front-end filters can be combined with antenna switches and transmit side filters into antenna filter/switchplexer modules. This approach, however, may be reaching the limits of its integration density and cannot scale to filter banks handling, e.g., 1 GHz of input spectrum or more, as would be used in cognitive radio particularly when two or more channels are "aggregated." In addition, cognitive radio terminals operate over much larger input bandwidths (e.g., 1 GHz) and thus may benefit from reconfigurable RF filters between the antenna and the receiver to reduce the large interference from other users. Thus, there is a need for the proposed reconfigurable BAW filter arrays co-integrated with other circuitry, such as on-top-of-CMOS. This integration can offer the unique benefit of very low parasitics between filters and RF circuits and can uniquely enable the co-integration across mechanical and electronic signal processing domains to enable reconfigurable banks of filters stretching over large input bandwidths.

Lateral-mode resonator topologies, such as a lateral overmoded bulk acoustic resonator (LOBAR) filter structure, can compare favorably to other mechanical filter classes. By contrast, filters based on electrostatic resonators suffer from large capacitive feedthrough since they need to use sub 100 nm gaps for efficient transduction, despite their high quality factors (>10,000) at low frequencies (10-100 MHz). The capacitive feedthrough generally precludes application of such electrostatic resonators to frequencies higher than 1 GHz.

In another approach, piezoelectric film-bulk-acoustic resonator (FBAR filters) can exhibit excellent performance (e.g., 3-4 dB insertion loss) including operation up to several GHz. However, the operational frequency of FBARs can be determined by their thickness dimension, which can make it unfeasible to implement large arrays of FBARs at different frequencies. An FBAR system can therefore only operate with a limited number of frequencies (e.g., less than 5) due to fabrication considerations. By contrast, the piezoelectric lateral-mode resonator filters described herein can span multiple frequencies, such as from 100 s of MHz to 10 GHz, e.g., on a single wafer, while offering low-loss performance, such as by using lateral dimensions that differ from one lateral-mode resonator structure to another. Such lateral dimensions can be established lithographically, in part, and are thus economical to fabricate and integrate well with existing processing techniques (e.g., CMOS processing).

In yet another approach, integration of a micro-electromechanical-system (MEMS) with CMOS circuitry can be accomplished. However, such an approach can involve substantial changes to the CMOS fabrication flow that are not easily tolerated in modern-day foundries. Ground-breaking performance improvements in MEMS resonator performance can be demonstrated, with impressive figures-of-merit, but it may be difficult to integrate large arrays of such stand-alone devices with transistor circuitry to construct large, comprehensive systems. Moreover, most integration efforts have been focused on system-in-package approaches (SIP), which may only allow for small arrays of resonators.

In contrast with certain CMOS/BAW approaches or MEMS approaches, an on-top-of-CMOS integration described herein can offer a very close coupling between the lateral-mode resonators and the underlying integrated circuit electronics (e.g. CMOS devices) and without the challenges of MEMS fabrication. The lateral-mode resonators can become, in effect, electromechanical circuit elements that can be incorporated in novel architectural concepts such as can optimally distribute the signal processing across the electronic and mechanical domains. In the approach proposed and described herein, monolithic CMOS-Piezo integration capability and RF IC capabilities can be leveraged to address various issues and challenges of incorporating large arrays of mechanical resonators with CMOS circuitry, including providing arrays having large numbers of resonators (e.g., dozens or more).

Lateral-Mode Resonator Device and Array Examples

Below, lateral-mode resonator structures are described, including lateral overmoded hulk acoustic resonators (LOBARs), and approaches for integrating arrays of LOBAR filters, such as for cognitive radio applications. Such resonators can be integrated on top of a semiconductor integrated circuit, such upon as a pre-fabricated semiconductor wafer including CMOS devices, without disrupting operating characteristics of the CMOS devices. In particular, LOBARs can be conceptualized as a special class of piezoelectric contour mode resonators (CMR) that can have frequencies set by their lateral dimensions. This architecture can allow integration of multiple frequencies on a single wafer, which is not possible using other FBAR technology.

Figure 1A:
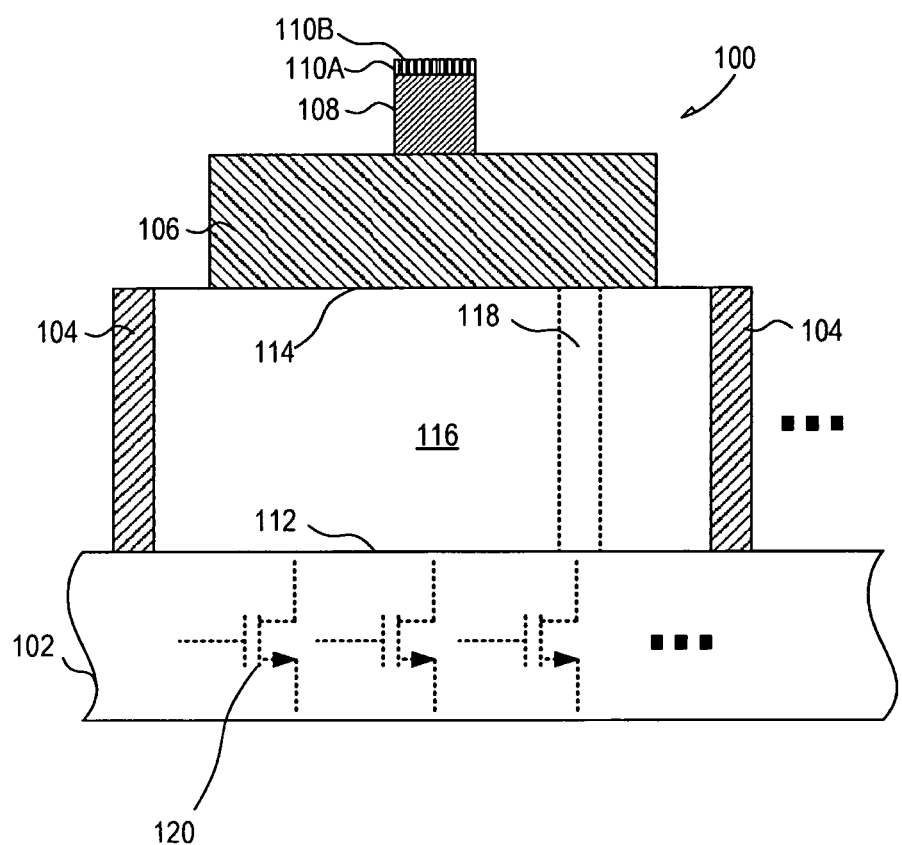
FIG. 1A illustrates generally an example of a cross-sectional view of a lateral-mode resonator structure, such as fabricated on a semiconductor integrated circuit.
Figure 1B:
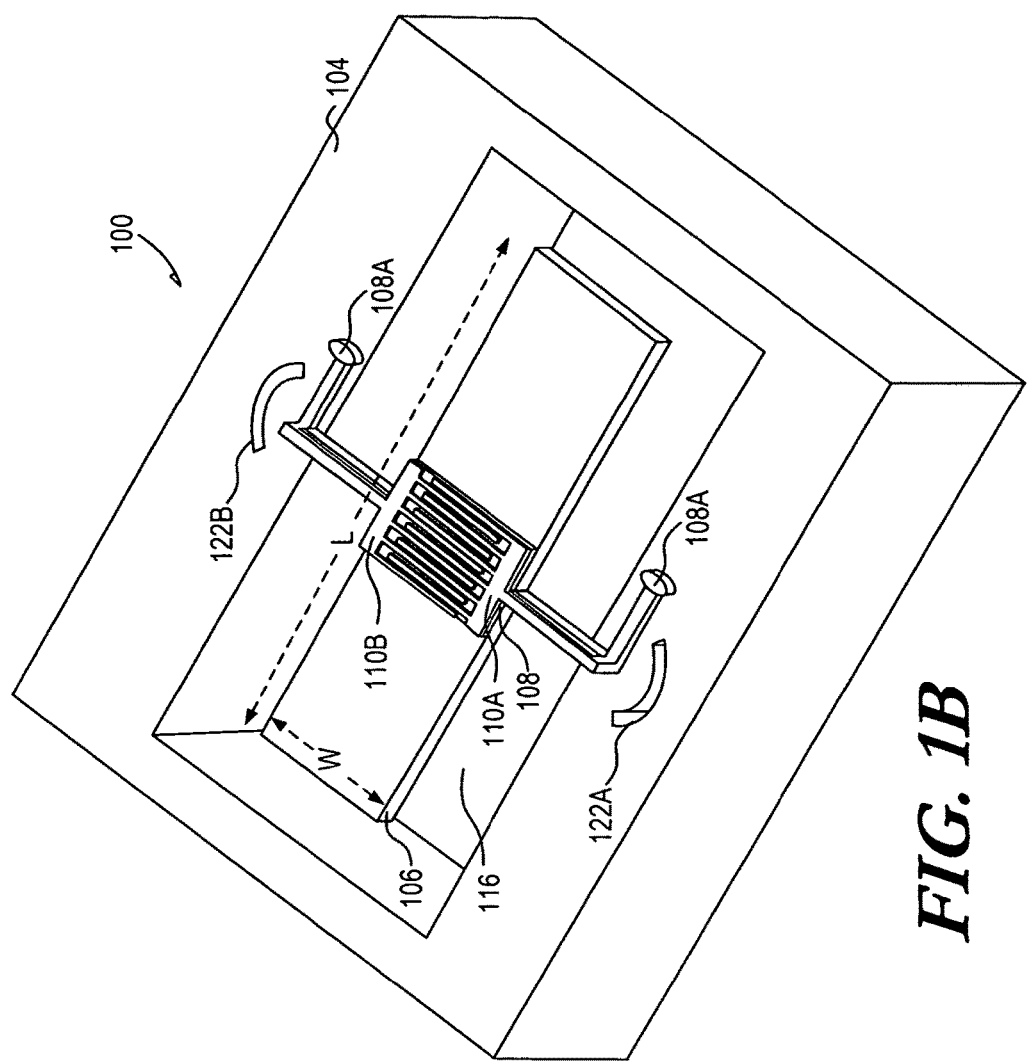
FIG. 1B illustrates generally a perspective view of the lateral-mode resonator structure of FIG. 1A.

FIG. 1A illustrates generally an example of a cross-sectional view of a lateral-mode resonator structure 100 (e.g., a LOBAR), such as can be fabricated on a semiconductor integrated circuit 102. FIG. 1B illustrates generally a perspective view of the lateral-mode resonator structure 100 of FIG. 1A. The lateral-mode resonator structure 100 can include an acoustic energy storage layer 106 (e.g., a film), such as deposited using a low temperature process specified to avoid disrupting the operating characteristics of one or more transistors (e.g., a transistor 120) fabricated on or within the semiconductor integrated circuit 102. A dielectric region 104 can provide a support structure, such as including an oxide.

In an example, the acoustic energy storage layer 106 can be suspended from the dielectric region 104, such as having an air gap in the region 116 between the acoustic energy storage layer 106 and a surface 112 of the semiconductor integrated circuit 102. Acoustic energy can be coupled to or from the acoustic energy storage layer 106 such as using a piezoelectric layer 108. The piezoelectric layer 108 can include dimensions specified so that the quality factor or one or more other characteristics of the lateral mode resonator 100 are dominated by acoustic energy storage layer 106 characteristics. One or more lateral dimensions such as a length, "L," or width "W," of the acoustic energy storage layer 106 can be specified, such as to provide one or more specified operating characteristics (e.g., quality factor, resonant frequency, or impedance).

One or more electrical conductors such as a first contact region 110A or a second contact region 110B can be used to couple electrical signals to or from the piezoelectric layer 108. In the example of FIGS. 1A and 1B, the first and second contact regions 110A and 100B are interdigitated on a surface of the piezoelectric layer 108. In another example, the first contact region 110A can be located on a first surface of the piezoelectric layer 108, and the second contact region 110B can be located upon a second surface opposite the first surface.

In the co-integrated configuration of FIGS. 1A and 1B, the lateral-mode resonator 100 can share the substrate of the semiconductor integrated circuit 102, and can be electrically coupled to other circuitry included as a portion of the semiconductor integrated circuit 102, such as using one or more via structures (e.g., a via 118 as shown in FIG. 1A, or corresponding vias 118A or 118B as shown in FIG. 1B). Such vias can electrically couple the resonator 100 to one or more pads on a surface 112 of the integrated circuit 102. In this manner, wire bonding is not required and parasitics associated with such wire bonding can be avoided.

A lateral-mode resonator 100 can include stacking a piezoelectric CMR (e.g., provided by the piezoelectric layer 108), upon a nearly freestanding block of low-loss energy storage mass (e.g., Si or SiC, such as provided by the acoustic energy storage layer 106). If the volume of the low-loss material is larger than that of the piezoelectric material, the bulk of the resonant energy will be stored in the low-loss medium. The composite structure can then exhibit much higher quality factor (Q) than pure piezoelectric resonators, where the mechanical energy is stored in the more-lossy piezoelectric material. The lateral-mode resonator 100 can also be a released configuration (e.g., a suspended configuration as shown illustratively in FIG. 1A or 1B), that can offer superior electrical and mechanical isolation between lateral-mode resonator 100 and the substrate and between individual lateral-mode resonator 100. In an example, first and second acoustic reflectors 122A and 122B can be included as a portion of the dielectric region 104, such as to enhance acoustic isolation between the suspended acoustic energy storage layer 106 and the dielectric region 104.

In another example, an acoustic mirror can be located in the region 116 between the deposited acoustic energy storage layer and the semiconductor integrated circuit instead of (or in addition to) suspending the acoustic energy storage layer 106. For example, the acoustic mirror can include an acoustic Bragg structure having layers including alternating or specified acoustic impedances, and the overall Bragg structure can be configured to suppress outcoupling or loss of acoustic energy from the acoustic energy storage layer 106 to the substrate or other portions of the resonator 100.

Low-loss materials such as poly-crystalline Si and SiC are particularly well suited for use as an energy storage mass for the lateral-mode resonator 100. Both materials, however, generally require high thermal budgets for deposition and are unsuitable for realization with on-top-of-CMOS post-processing fabrication, such as due to damage caused to the underlying CMOS devices. The present inventors have recognized, among other things, that high-quality Si can be deposited and recrystallized, such as using low-temperature excimer laser recrystallization (e.g., having a 70 degree Celsius maximum temperature). Operating characteristics of underlying CMOS devices have been unchanged by such Si deposition and recrystallization processing, according to studies performed using similar processing on 8-inch wafers.

Figure 2:
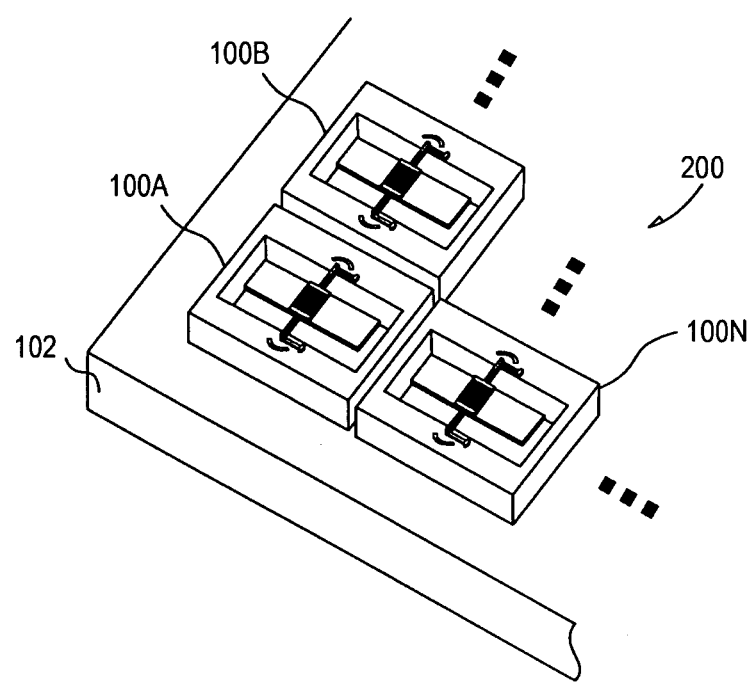
FIG. 2 illustrates generally an array of lateral-mode resonators, such as can include resonators as shown illustratively in FIG. 1A or 1B.

FIG. 2 illustrates generally an array of lateral-mode resonators 100A, 100B, through 100N, such as can include resonators as shown illustratively in FIG. 1A or 1B. Using low-temperature piezoelectric deposition and Si-deposition capabilities, such as to provide a lateral-mode resonator 100 as shown in FIG. 1A or 1B, a laterally-defined, multi-frequency array of lateral-mode resonators can be fabricated, such as by post-processing a semiconductor integrated circuit. For example, such an array can include an array of LOBAR devices fabricated on top of an integrated circuit having CMOS devices. Such an approach can provide resonators, and thus filters, that can include dimensions specified to cover filtering applications across a large range of frequencies, such as from about 100 s of megahertz (MHz) to about 10 gigahertz (GHz), such as an array fabricated on top of the same chip in a single post-CMOS fabrication step with a very small mask set and a minimum of parasitics. This is a significant advance beyond other approaches (e.g., including vertically-tuned FBARs), in which the resonance is defined by vertical thickness and in which multi-frequency operation requires different material deposition steps and additional masking. Frequency tuning through thickness quickly becomes impractical for large arrays of filters and the parasitic for package-level integrated systems are considerable.

An additional useful potential advantage of building a lateral-mode resonator array upon a semiconductor integrated circuit (e.g., upon an RF transceiver chip or other communication circuit) is that interconnect parasitics can be reduced or minimized between the high-quality-factor electromechanical resonators and the underlying integrated circuit. This is in contrast to other approaches, in which the resonators are generally built on separate substrates and connected through wirebonds and millimeter scale packages. By removing these parasitics and making the resonators available with a wide choice of operating parameter including impedance and resonant frequency, the resonators become a family of new circuit elements available to the RF engineer for various applications. This opens up unique opportunities for novel circuits and architectures as further described herein. In an example, an FBAR or other resonator structure can be co-integrated with one or more lateral-mode resonators as shown and described herein. While the applications herein focus on switchable filters, other circuits can be provided, such as one or more of a balun, diplexer, or an oscillator, such as using a lateral-mode resonator coupled to one or more switches or active circuits.

Filter Circuit Configurations and Simulation Results

Figure 3:
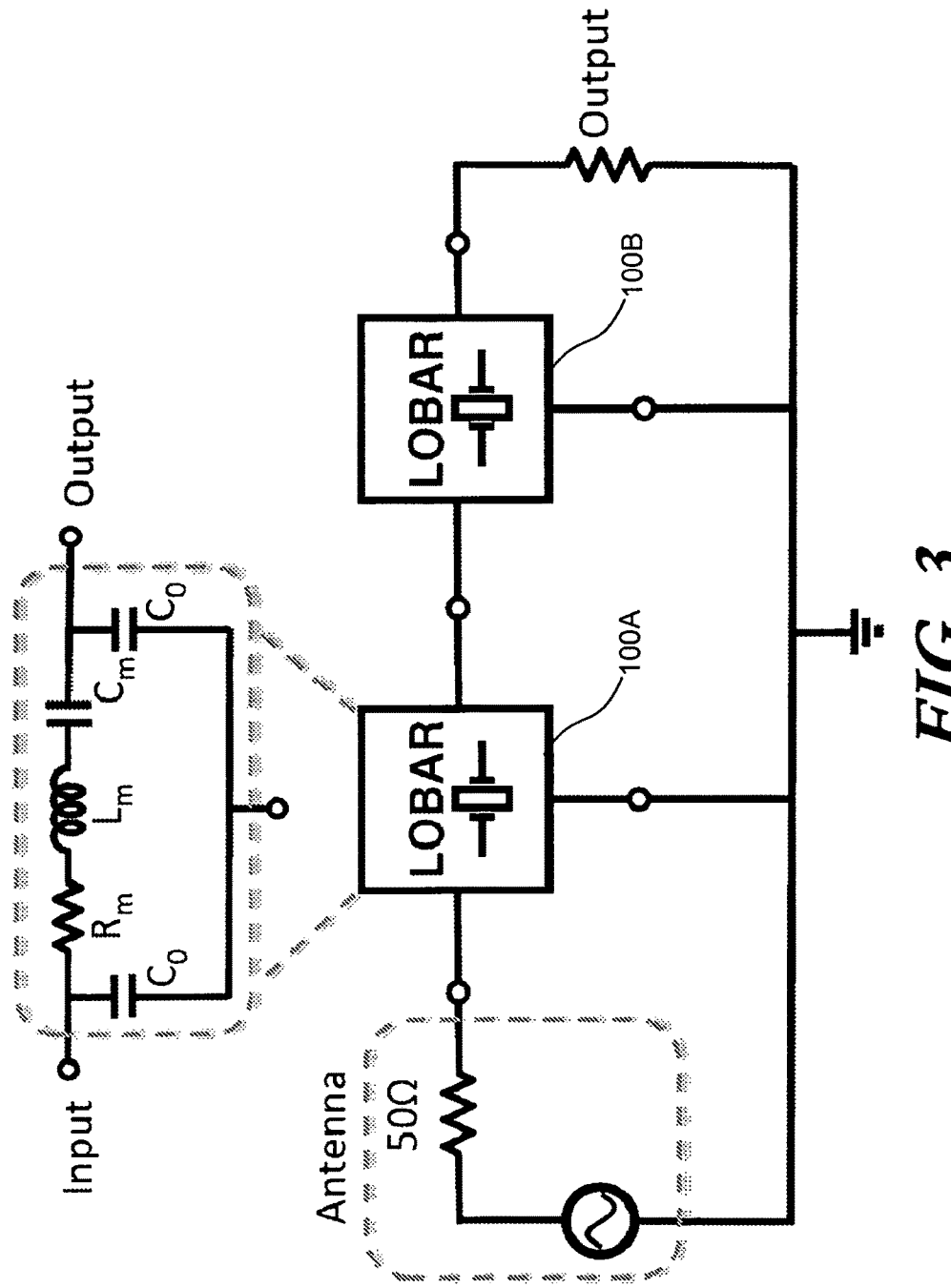
FIG. 3 illustrates generally an example of an electrical circuit, such as can include two or more resonators.

FIG. 3 illustrates generally an example of an electrical circuit, such as can include two or more resonators (e.g., two or more LOBAR resonators). Each lateral-mode resonator (e.g., LOBAR) resonator can be represented by an equivalent circuit as shown in FIG. 3, such as including shunt capacitances $C_0$, and series elements $R_m$, $L_m$, and $C_m$. In illustrative example, experimentally-obtained material properties assuming a ZnO piezoelectric layer for the lateral-mode resonator (e.g., as can be used for on-top-of-CMOS FBAR biosensing arrays) yielded a quality factor (Q) of 450 and an electromechanical coupling coefficient ($k^2_t$) of 2.1%.

Similarly, extracted characteristics were obtained for on-top-of CMOS deposited poly-Si film. With these experimentally verified material characteristics, the equivalent circuit shown in FIG. 3 can be used to perform a simulation study of the RF LOBAR filter performance. The simulation model assumed a $k_t^2$ value of 1.8% and a Q value of 2800. Without being bound by theory, the present inventors expect that such performance is feasibly through further improvements to the lateral-mode resonator device structure and consistent with expectations.

For purposes of simulation, the filter topology shown in FIG. 3, including two coupled LOBAR resonators, was used. Such a topology can rely upon intrinsic capacitances of the resonators, in part, to provide a filter. For this simulation study, conductive electrical coupling of the resonators was used, as shown in FIG. 3, but other techniques can be used such as can include mechanical coupling.

Figure 4:
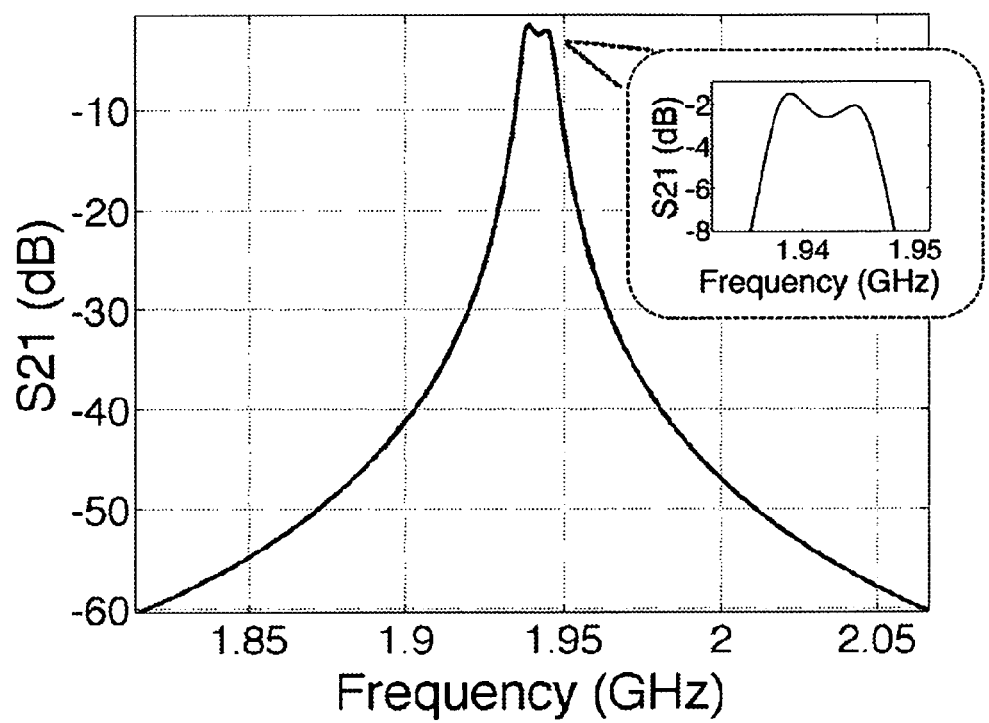
FIG. 4 illustrates generally an illustrative example of a transfer characteristic of a lateral-mode resonator obtained using simulation.

FIG. 4 illustrates generally an illustrative example of a transfer characteristic of a lateral-mode resonator obtained using simulation, illustrating generally a 1.94 GHz bandpass filter having a 3 dB bandwidth of about 12 MHz. The filter can be driven at the input port with a 50Ω input source representing an antenna and can be loaded with 120Ω representing an input impedance of the RF receiver. The maximum in-band simulated insertion loss is only about 2.6 dB, which compares very favorably with other approaches to front-end filters. The filter shows a rapid transition between pass-band and stop-band and large out-of-band rejection of 60 dB. The current simulation model does not account for spurious resonances, however this is believed to be a good approximation; spurious modes can be highly suppressed, such as using mechanical isolation structures, if needed.

The simulation did not model non-linearities, but third-order-intercept (HP3) values greater than +50 dBm can be demonstrated for similar structures. A filter corresponding to the simulation results of FIG. 4 will occupy an approximate area of only 100 micrometers (μm)×20 μm, or 0.002 millimeters$^2$ (mm$^2$). Other approaches to complex RFIC transceivers can occupy areas of several mm$^2$ so that many hundreds of resonators can be integrated upon such transceivers using the techniques and configuration described herein.

Figure 5A:
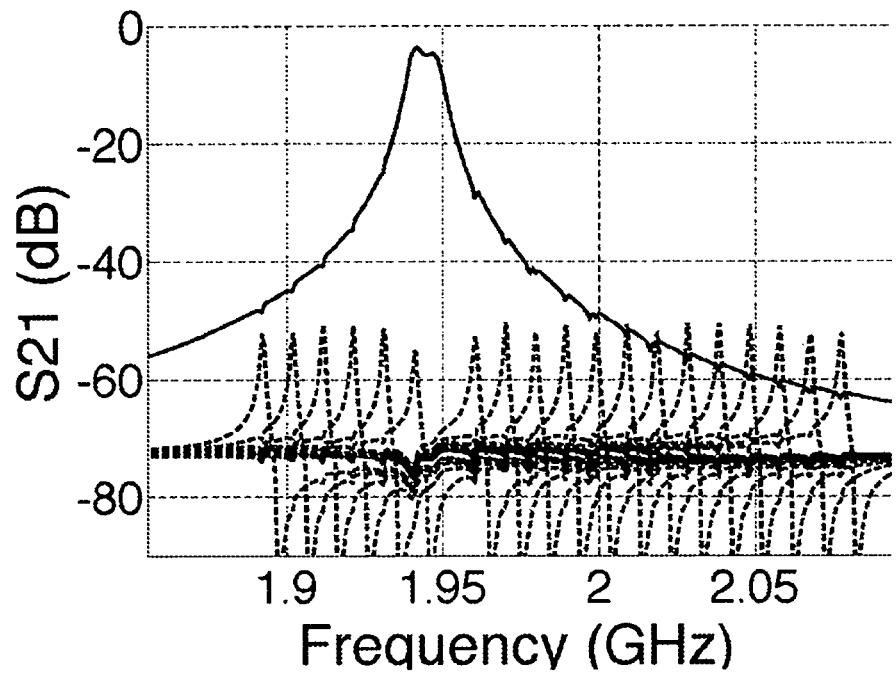
FIGS. 5A through 5C illustrate generally illustrative examples of transfer characteristics of an array of switchable filters such as can be included in the radio architecture of FIG. 6.
Figure 5B:
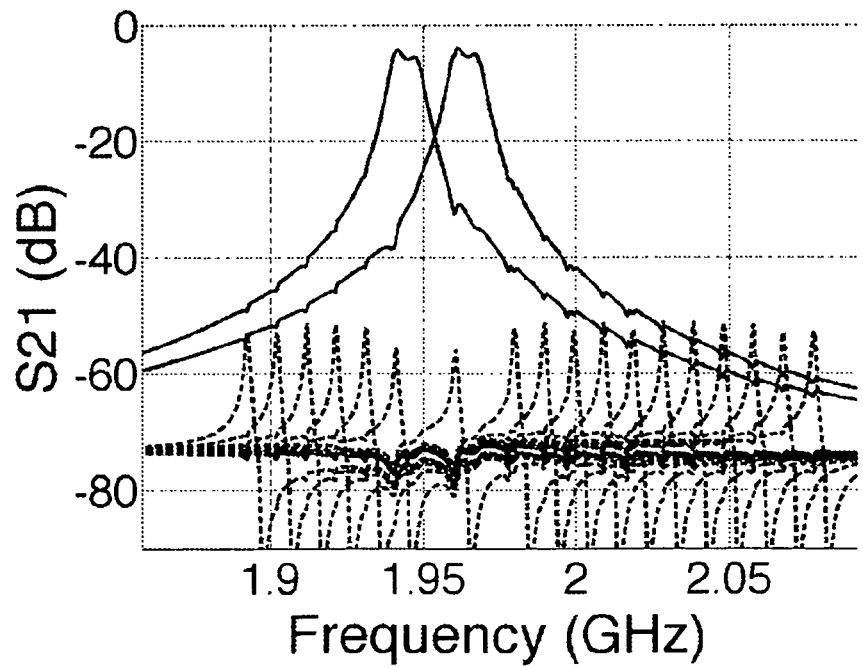
Figure 5C:
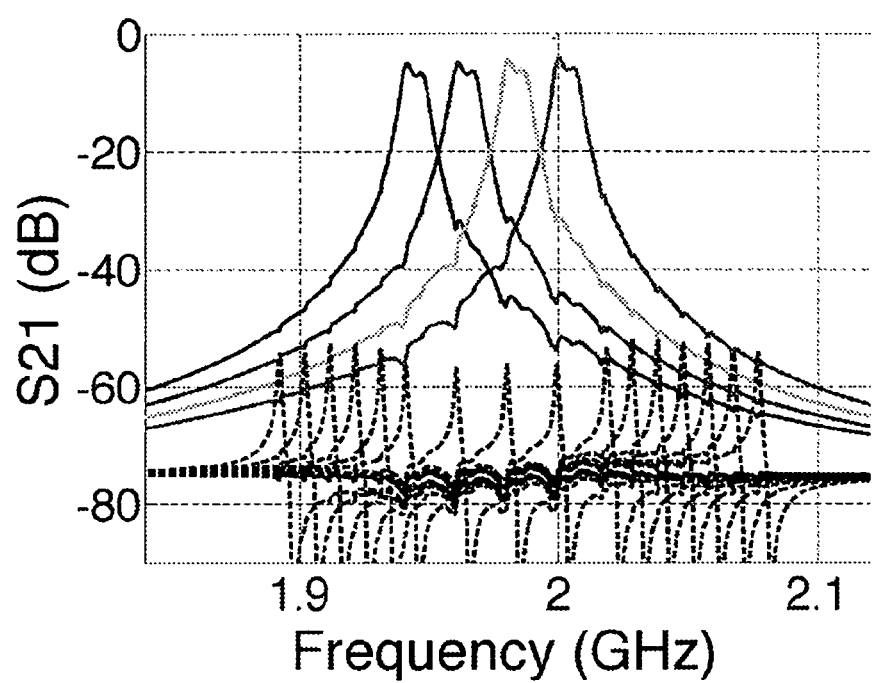

FIGS. 5A through 5C illustrate generally illustrative examples of transfer characteristics of an array of switchable filters such as can be included in the radio architecture of FIG. 6. For illustrative examples of FIG. 5A through 5C, a simulation was carried out for up to 20 filters in a bank. Low-loss, linear switches between the antenna and filters can be very challenging to implement. Other approaches using CMOS RF antenna switches for high performance switchplexers such as described elsewhere herein can be fabricated using special technologies such as including compound semiconductors or silicon-on-insulator (SOI) CMOS processes. By contrast, the approach as proposed and described herein, can reduce the number of outputs of the switchplexer as much as possible, such as by coupling the inputs of a large number of RF filters together. In an example, coupling the inputs of 20 LOBAR filters together in an array and connecting it to a 50Ω antenna, can lead to an unacceptably high insertion loss of over 13 dB, such as shown in Table 1, below.

This degradation can be attributed to a loading effect caused by the intrinsic capacitance of each filter. Adding more filters in parallel would cause further unacceptable loading of the antenna. A solution for implementing large banks of filters is to alternately turn on small sub-banks of filters, such as to decrease or minimize the instantaneous capacitive loading of the antenna. This can involve using low-loss high-frequency switches, but implementing a large bank of switches using current module-type integration technology may be difficult or unfeasible, such as due to interconnect parasitics and large component counts.

TABLE 1

Illustrative example including simulated insertion loss of on-top-of-CMOS LOBAR filters reconfigurable with CMOS switches.

| | Insertion Loss [dB] | | |
|---|---|---|---|
| | NO Switches | Bulk CMOS Switches | SOI CMOS Switches |
| | 1 Filter | | |
| 1 Filter ON | −2.60 | −3.60 | −3.78 |
| | Bank of 4 Filters | | |
| 1 Filter ON | −2.63 | −3.77 | −3.89 |
| 2 Filters ON | −2.99 | −4.28 | −4.32 |
| 4 Filters ON | −4.14 | −5.22 | −5.24 |
| | Bank of 20 Filters | | |
| 1 Filter ON | −12.51 | −4.94 | −4.13 |
| 2 Filters ON | −13.07 | −5.60 | −4.66 |
| 4 Filters ON | −13.89 | −7.01 | −5.78 |

Whereas CMOS switches in the input signal path of a filter are generally to be avoided, with an on-top-of-CMOS approach, many CMOS switches with almost no interconnect parasitics can be used in the output signal path, such as in part due to relaxed linearity requirements after the filter. Switches can also be included in a ground or return path of the filter, such as to isolate as much as possible the inactive filters from the active filters in the bank (see, e.g., FIG. 6). Such techniques are believed applicable to silicon-based devices, or other semiconductor integrated circuits such as GaN, AlGaAs, or SiC, for example.

FIG. 6 illustrates generally an example of a radio architecture that can include an array of filters selectively coupleable to an antenna, where the filters can include lateral-mode resonators. As mentioned above, simulations of various filter bank configurations combining LOBAR RF filter models with switch devices in bulk CMOS and SOI can be performed, such as using a 65 nanometer switch device, such as to obtain the results shown in TABLE 1. Bulk CMOS simulations can be performed using a commercially-available 65 nm CMOS design kit. For the SOI examples, switch models can be used that remove the $C_{db}$ (e.g., a drain-to-body capacitance) of the 65 nm switch while keeping all other resistive and capacitive parasitics in place.

As a point of reference, a bank of four filters in parallel can allow simultaneous sampling of a 48 MHz bandwidth. Connecting four such ideal filters in parallel yields in-band loss of 4.3 dB according to simulation (e.g., see TABLE 1). Incorporating transistor switches (e.g., similar to the illustration of FIG. 6) such as to rapidly activate/deactivate filter blocks, can cause a slight degradation in the insertion loss by about 1 dB according to simulation.

For purposes of comparison, the input ports of 20 filters were simulated as hardwired to a 50Ω antenna (e.g., as shown schematically in FIG. 6). FIG. 5A through 5C show the separate states of one, two and four filters activated while also showing the inactive filters (black traces). Each filter can be activated or deactivated, such as using switches at the indicated locations. Activating a single bank of 4 filters in this configuration yields a worst-case simulated insertion loss of 7.01 dB (see, e.g., FIG. 6). TABLE 1 illustrates generally that such loss represents a 6.9 dB improvement compared to 20 directly connected filters. Basic 65 nm bulk CMOS switches can offer limited isolation in their OFF state due to the drain-body parasitic capacitance which can impact the achievable loss characteristics. The switch transistor design may be optimized, however. The system can also be implemented using an SOI (silicon-on-insulator) technology. SOI switches exhibit much lower parasitic capacitances than those in bulk CMOS technologies. Using SOI switches in lieu of bulk CMOS switches, the simulated insertion loss improves by 1.2 dB (as shown in TABLE 1). The simulated performance improvement stems from the reduced parasitic loading capacitance that is accumulated with the addition of more filter branches in the array.

As described in other examples herein, a custom RF front-end IC can be provided, on top of which the lateral-mode resonator filter array can be fabricated. The RF IC can have an active 'low-noise-amplifier' (LNA) switch matrix into an array of four direct-conversion receiver down-conversion paths, such as to support bandwidth aggregation of up to four channels. For purposes of experiment, a signal path can be established using LNAs+downconversion mixers+baseband amplifiers co-integrated within a semiconductor integrated circuit, but using off-chip A/D converters and off-chip LO generators. However, lateral-mode resonators fabricated upon an integrated circuit (e.g., on-top-of-CMOS LOBAR resonators) also offer interesting opportunities for co-integration of high performance local oscillator (LO) source configurations.

In an example, a dedicated cascoded current-mode noise-canceling LNA stage can be attached to the respective filter outputs. For 2.7-3.7 GHz operation, these LNAs only need a handful of transistors (e.g., less than 6) and can occupy a small area since only active devices can be used. To save power, the LNAs can be turned OFF when the filter is not in use. The LNA outputs can be routed through a CMOS multiplexer into one of the four downconversion paths. This can include using high performance RF receivers for various applications.

Using the highly selective lateral-mode resonant front-end filters in the array, the power consumption of the receiver electronics can be reduced, such as in conjunction with significantly reduced linearity requirements. Even with an in-band loss of up to 5 dB or 7 dB in a channel filter in a 20-filter bank, given the relaxed linearity requirements, receivers with an overall noise figure of better than 9 dB to 11 dB are expected to be feasible. This is sufficient for small cell deployment scenarios in cognitive radio applications. Furthermore, the loss estimates for the filters are preliminary and as outlined below, it may be possible to reduce the filter loss even further. The simulation results presented so far clearly demonstrate the unique potential of lateral-mode resonators built upon semiconductor integrated circuits (e.g., on-top-of-CMOS BAW resonators).

Fabrication Techniques

Figure 7:
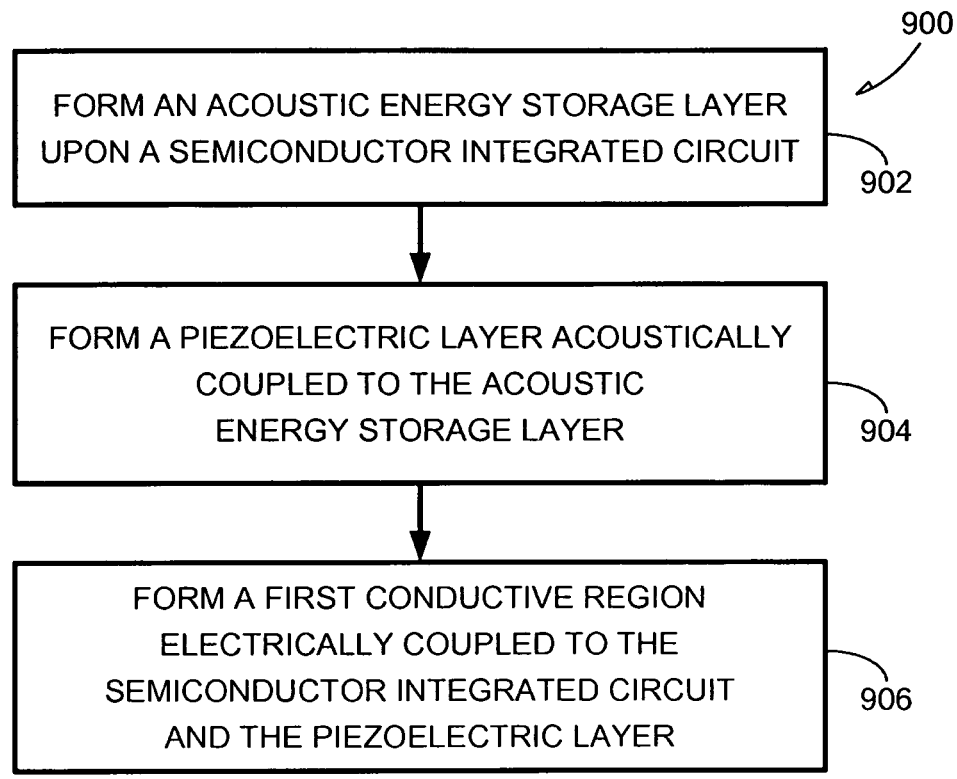
FIG. 7 illustrates generally a technique, such as a method, that can include forming a lateral-mode resonator.

FIG. 7 illustrates generally a technique 900, such as a method, that can include forming a lateral-mode resonator. At 902, an acoustic energy storage layer can be formed upon a surface of a semiconductor integrated circuit. As mentioned in relation to FIGS. 1A and 1B, and elsewhere, the semiconductor integrated circuit can be provided including transistor structures. Formation of the acoustic energy storage layer therefore generally includes low-temperature processing (e.g., below 400 degrees Celsius, or below 450 degrees Celsius), so as to avoid disrupting the operating characteristics of the underlying transistor structures.

The present inventors have recognized, among other things, that the acoustic energy storage layer can include a semiconductor material. For example, an oxide layer can be formed as a release layer. The acoustic energy storage layer can be deposited on the oxide layer. The acoustic energy storage layer can include silicon. For example, the acoustic energy storage layer can include silicon carbide or polycrystalline silicon. In an example, the silicon of the acoustic energy storage layer can be fabricated using one or more of laser recrystallization (e.g., continuous wave), excimer laser recrystallization, sequential lateral solidification, flashlamp annealing (e.g., Xe lamp exposure), or metal-catalyzed solid phase recrystallization. Such techniques can be performed at low temperature such as to avoid disrupting operational characteristics of other devices formed as a portion of the semiconductor integrated circuit. A grain structure of a recrystallized or otherwise re-formed acoustic energy storage layer can be visibly different (e.g., larger grain texture) than the grain structure of a deposited acoustic energy storage layer lacking such recrystallization or re-forming.

At 904, a piezoelectric layer can be formed, such as acoustically-coupled to the acoustic energy storage layer. The dimensions of the piezoelectric layer can be specified so that the bulk of the acoustic energy is stored in the lower-loss acoustic energy storage layer. Various materials can be used for the piezoelectric layer. For example, ZnO, AlN, $LiNiO_3$, one or more ferroelectric titanates, or combinations thereof can be used. Such ferroelectric titanates can include BST or PZT, for example. The piezoelectric layer can be deposited, such as upon the acoustic energy storage layer, such as using one or more of an atomic layer deposition (ALD) technique, physical layer deposition (e.g., sputtering, such as using one or more of RF, DC, or pulsed DC), solution processing (e.g., using a sol-gel or conversion oxide medium), pulsed laser deposition, metal organic vapor phase deposition (e.g., MOCVD), or molecular beam epitaxy (MBE).

At 906 one or more of a first or second conductive region can be formed, such as electrically coupled to the semiconductor integrated circuit and the piezoelectric layer. In this manner, the piezoelectric layer and conductive regions can form an electromechanical transducer, such as in the configuration of a contour-mode resonator (CMR). The conductive regions can include tungsten, for example, or one or more other conductive materials (e.g., such as formed using one or more metallization and patterning techniques as used for metal layers for other semiconductor device structures). The resonator structure can be released from the supporting oxide structure or the fabrication technique can include deposition of alternating layers of material to form an acoustic Bragg mirror below the acoustic energy storage layer (as discussed above in relation to FIGS. 1A and 1B).

As mentioned elsewhere herein, vertical film bulk acoustic resonators (FBARs) are resonator topologies that can be used in discrete filter implementations. Arrays of single frequency FBARs on top of CMOS can be demonstrated, such as for sensing applications. The resonators can be directly coupled to CMOS transistors, such as to form oscillators whose frequency changes depending on the mass accumulated on the functionalized top surface of the FBAR resonator. The CMOS integration can be made possible by a process for depositing a high-quality piezoelectric Zinc Oxide (ZnO) thin-film above CMOS at temperatures lower than 150° C. This low thermal budget causes no degradation in the underlying CMOS transistor circuits allowing for integration with virtually any commercial CMOS or other semiconductor technology, such as after fabrication of a commercially-available CMOS wafer including other circuitry. ZnO has twice the theoretical electromechanical coupling coefficient ($k_t^2$) of AlN (other FBARs generally use AlN), which can allow the implementation of filters with larger bandwidths and lower impedance levels. These techniques are believed generally applicable to the lateral-mode resonators described herein.

It may be possible to further improve lateral-mode filter performance. The loss characteristics of a mechanical filter are generally limited by the $k_t^2 \cdot Q$ product of the constituent resonators and there are a number of avenues for improvement beyond what is presented in the above simulation results. A variety of loss paths exist due to sub-optimal clamping and isolation of the devices from the underlying substrate. There is also a significant opportunity for further improvement in the lateral-mode resonator devices by engineering the electrodes (e.g., to yield a higher Q), using mechanical tethers or anchors, using acoustic mirrors (to suppress spurious modes/overmodes and improve Q), or by incorporating mechanically-coupled structures (e.g., to simplify the system-level design).

(1) Quality Factor Boosting Through Damping Reduction: It has been demonstrated experimentally that a substantial portion of loss in piezoelectric mechanical resonators can at the interface between the piezoelectric material and the metallic electrodes, such as due to thermoelastic damping. Incorporating small gaps (~100-300 nm) between the electrodes and the piezoelectric material can boost the quality factor by approximately 3 times without requiring any additional modifications to the structure.

(2) Quality Factor Boosting Through Improved Clamping: Another avenue for enhancing resonator performance is through improved clamping techniques. Most mechanical resonators are held in place by thin tethers to their underlying substrate; see, e.g., FIG. 1B, in which one tether on each side holds the resonator. Experiments have shown that incorporating multiple tethers located at nodal points (points of minimum displacement) of the resonator spurious resonance modes can be strongly attenuated leading to an approximate doubling in quality factor.

(3) Enhancing Resonator Coupling for Larger Bandwidth: The filter simulations presented above correspond to electrically-coupled mechanical resonators. A hybrid coupling technique, in which the constituent resonators can be coupled mechanically into a block, which can subsequently be electrically coupled, can enhance filter bandwidth while also reducing pass-band ripple and ultimately reducing in-band loss. Without being bound by theory, it is believed that incorporating such a coupling scheme can ultimately allow for sub-5 dB insertion loss over large banks of more than 20 filters. Furthermore, different electrical coupling techniques can be incorporated.

In the presented simulations, the filters were coupled by series connection with coupling taking place through the intrinsic capacitance of the resonators. Other more sophisticated electrical coupling topologies, e.g., lattice, can help improve filter loss characteristics.

(4) Overmodes for Periodic Responses: The resonators used in the simulation operate at their fundamental frequency. Operating at a higher overtone of its fundamental ("overmoding") can increase quality factor and can reduce loss. However overmoding can result in a periodic response that repeats according to the overmoding number. Such modes can be suppressed, such as using acoustic reflectors built into the resonator design. Another option is to use the overmoding advantageously by coupling it with one or more intelligent bandwidth aggregation techniques. Since the filter's response repeats periodically, a single filter can be used to cover multiple segregated bandwidths, which can lead to a reduction in the number of required filters.

(5) Device Packaging: Certain classes of MEMS devices, such as electrostatic resonators, use a vacuum environment to minimize damping, which can severely complicate the package design and increase cost. Lateral-mode resonators and piezoelectric resonators can generally operate at atmospheric pressure and simply use a hermetic seal to inhibit or prevent contamination, which is relatively easy and cheap to construct. This can make use of low-cost, wafer-level hermetic packages that are compatible with standard foundry CMOS wafers, such as are available commercially, e.g., from InvenSense, of Sunnyvale, Calif., USA.

(6) Performance Sensitivity to Process Variations and Temperature: The lateral-mode resonator filters described herein are expected to be operated in a variety of applications across a range of different temperatures. Thermal expansion and a change in stiffness with temperature may lead to some change in the resonant frequency of mechanical resonators as a function of temperature. Active temperature compensation techniques can waste precious power, so it is desired that filter performance be as temperature stable as possible using passive compensation methods. Lateral piezoelectric resonators can be passively compensated. An approach can include stacking the piezoelectric resonator on a layer of material with the opposite temperature coefficient of stiffness. This can yield very high temperature stability of frequency (ppb/C) and can be directly applied to lateral-mode resonators such as LOBARs.

Various Notes & Examples

Example 1 can include or use subject matter (such as an apparatus, a method, a means for performing acts, or a device readable medium including instructions that, when performed by the device, can cause the device to perform acts), such as can include or use a semiconductor integrated circuit, and a first lateral-mode resonator fabricated upon a surface of a semiconductor integrated circuit. The first lateral-mode resonator can include a deposited acoustic energy storage layer including a semiconductor material, a deposited piezoelectric layer acoustically coupled to the deposited acoustic energy storage layer, a first conductive region electrically coupled to the deposited piezoelectric layer and electrically coupled to the semiconductor integrated circuit, where the semiconductor integrated circuit includes one or more transistor structures.

Example 2 can include, or can optionally be combined with the subject matter of Example 1, to optionally include a semiconductor integrated circuit comprising complementary metal-oxide-semiconductor (CMOS) devices.

Example 3 can include, or can optionally be combined with the subject matter of one or any combination of Examples 1 or 2 to optionally include a semiconductor material of the deposited acoustic storage layer comprising a recrystallized semiconductor material.

Example 4 can include, or can optionally be combined with the subject matter of one or any combination of Examples 1 through 3 to optionally include a dielectric region located upon a surface of the semiconductor integrated circuit, the dielectric region coupled to the deposited acoustic energy storage layer and defining a cavity between the deposited acoustic energy storage layer and the semiconductor integrated circuit, the acoustic energy storage including a released configuration suspended from the dielectric region.

Example 5 can include, or can optionally be combined with the subject matter of one or any combination of Examples 1 through 4 to optionally include an acoustic mirror located between the deposited acoustic energy storage layer and the semiconductor integrated circuit.

Example 6 can include, or can optionally be combined with the subject matter of one or any combination of Examples 1 through 5 to optionally include a second lateral-mode resonator fabricated upon the semiconductor integrated circuit and electrically coupled to the semiconductor integrated circuit, the second lateral-mode resonator having one or more lateral dimensions that are different from the first lateral-mode resonator.

Example 7 can include, or can optionally be combined with the subject matter of one or any combination of Examples 1 through 6 to optionally include an array of lateral-mode resonators fabricated upon the semiconductor integrated circuit, where at least some of the lateral-mode resonators are coupled to the semiconductor integrated circuit or to one another.

Example 8 can include, or can optionally be combined with the subject matter of Example 7, to optionally include a semiconductor integrated circuit having a transistor-based switch circuit configured to establish a signal path including a selected one or more of the lateral-mode resonators.

Example 9 can include, or can optionally be combined with the subject matter of Example 8, to optionally include a semiconductor integrated circuit having a transistor-based switch circuit configured to select amongst two or more filter circuits, the filter circuits including a specified one or more of the lateral-mode resonators included in the array.

Example 10 can include, or can optionally be combined with the subject matter of one or any combination of Examples 1 through 9 to optionally include a second resonator having a structure and impedance different from the first lateral-mode resonator.

Example 11 can include, or can optionally be combined with the subject matter of Example 10, to optionally include a second resonator comprising a bulk acoustic wave resonator fabricated upon the semiconductor integrated circuit and electrically coupled to one or more of the first lateral-mode resonator or the semiconductor integrated circuit.

Example 12 can include, or can optionally be combined with the subject matter of one or any combination of Examples 1 through 11 to optionally include a first lateral-mode resonator electrically coupled to the semiconductor integrated circuit without requiring use of a wire bond, where the first lateral-mode resonator and semiconductor integrated circuit share a common semiconductor substrate.

Example 13 can include, or can optionally be combined with the subject matter of Example 12, to optionally include a first lateral-mode resonator electrically-coupled to the semiconductor integrated circuit using a via structure included as a portion of the first lateral-mode resonator coupled to a pad on the semiconductor integrated circuit.

Example 14 can include, or can optionally be combined with the subject matter of one or any combination of Examples 1 through 13 to optionally include a deposited piezoelectric layer comprises ZnO, and where the semiconductor material of the deposited acoustic energy storage layer includes silicon.

Example 15 can include, or can optionally be combined with the subject matter of one or any combination of Examples 1 through 14 to optionally include a semiconductor material of the deposited acoustic energy storage layer comprising silicon carbide.

Example 16 can include, or can optionally be combined with the subject matter of one or any combination of Examples 1 through 15 to include, subject matter (such as an apparatus, a method, a means for performing acts, or a machine readable medium including instructions that, when performed by the machine, that can cause the machine to perform acts), such as can include a semiconductor integrated circuit including complementary metal-oxide-semiconductor (CMOS) transistor structures, an array of lateral-mode resonators fabricated upon the semiconductor integrated circuit, including a first lateral-mode resonator fabricated upon a surface of a semiconductor integrated circuit, the first lateral-mode resonator comprising a deposited acoustic energy storage layer including a recrystallized semiconductor material, a deposited piezoelectric layer acoustically coupled to the deposited acoustic energy storage layer, and a first conductive region electrically coupled to the deposited piezoelectric layer and electrically coupled to at least one of the transistor structures of the semiconductor integrated circuit.

Example 17 can include, or can optionally be combined with the subject matter of Example 16, to optionally include a dielectric region located upon a surface of the semiconductor integrated circuit, the dielectric region coupled to the deposited acoustic energy storage layer and defining a cavity between the deposited acoustic energy storage layer and the semiconductor integrated circuit, where the acoustic energy storage layer includes a released configuration suspended from the dielectric region.

Example 18 can include, or can optionally be combined with the subject matter of Example 17, to optionally include an acoustic mirror located between the deposited acoustic energy storage layer and the semiconductor integrated circuit.

Example 19 can include, or can optionally be combined with the subject matter of one or any combination of Examples 1 through 18 to include, subject matter (such as an apparatus, a method, a means for performing acts, or a machine readable medium including instructions that, when performed by the machine, that can cause the machine to perform acts), such as can include forming an acoustic energy storage layer upon a surface of a semiconductor integrated circuit using a low-temperature deposition technique, the low-temperature deposition technique including a maximum temperature specified not to disrupt operating characteristics of transistor structures included as a portion of the semiconductor integrated circuit, forming a piezoelectric layer acoustically coupled to the deposited acoustic energy storage layer, forming a first conductive region electrically coupled to the deposited piezoelectric layer and electrically coupled to the semiconductor integrated circuit, where the acoustic energy storage layer, the piezoelectric layer, and the first conductive region are included as a portion of a lateral-mode resonator.

Example 20 can include, or can optionally be combined with the subject matter of Example 19, to optionally include forming an array of lateral-mode resonators upon the surface of the semiconductor integrated circuit, where the semiconductor integrated circuit includes complementary metal-oxide-semiconductor (CMOS) transistor structures.

Example 21 can include, or can optionally be combined with the subject matter of one or any combination of Examples 19 or 20 to optionally include D recrystallizing a deposited semiconductor material using a laser.

Example 22 can include, or can optionally be combined with the subject matter of one or any combination of Examples 19 through 21 to optionally include forming a dielectric region located upon a surface of the semiconductor integrated circuit, the dielectric region coupled to the deposited acoustic energy storage layer and defining a cavity between the deposited acoustic energy storage layer and the semiconductor integrated circuit, where the acoustic energy storage layer includes a released configuration suspended from the dielectric region.

Example 23 can include, or can optionally be combined with the subject matter of one or any combination of Examples 19 through 22 to optionally include forming an acoustic mirror located between the deposited acoustic energy storage layer and the semiconductor integrated circuit.

Example 24 can include, or can optionally be combined with the subject matter of one or any combination of Examples 19 through 23 to optionally include a temperature used for forming the acoustic energy storage layer less than about 450 degrees Celsius.

Example 25 can include, or can optionally be combined with the subject matter of one or any combination of Examples 19 through 24 to optionally include a temperature used for forming the acoustic energy storage layer less than about 400 degree Celsius.

Example 26 can include, or can optionally be combined with any portion or combination of any portions of any one or more of Examples 1 through 25 to include, subject matter that can include means for performing any one or more of the functions of Examples 1 through 25, or a machine-readable medium including instructions that, when performed by a machine, cause the machine to perform any one or more of the functions of Examples 1 through 25.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and 13," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features or a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. An electrical circuit assembly, comprising:
   a semiconductor integrated circuit; and
   a first lateral-mode resonator fabricated upon a surface of the semiconductor integrated circuit, the first lateral-mode resonator comprising:
   a deposited acoustic energy storage layer comprising a semiconductor layer;
   a deposited piezoelectric layer acoustically coupled to the deposited acoustic energy storage layer;
   a first conductive region electrically coupled to the deposited piezoelectric layer and electrically coupled to the semiconductor integrated circuit; and
   an acoustic mirror located between the deposited acoustic energy storage layer and the semiconductor integrated circuit;
   wherein the semiconductor integrated circuit includes one or more transistor structures.

2. The electrical circuit assembly of claim 1, wherein the semiconductor integrated circuit comprises complementary metal-oxide-semiconductor (CMOS) devices.

3. The electrical circuit assembly of claim 1, wherein the semiconductor layer of the deposited acoustic storage layer comprises a silicon layer.

4. The electrical circuit assembly of claim 1, comprising:
a dielectric region located upon a surface of the semiconductor integrated circuit, the dielectric region coupled to the deposited acoustic energy storage layer and defining a cavity between the deposited acoustic energy storage layer and the semiconductor integrated circuit;
wherein the acoustic energy storage layer includes a released configuration suspended from the dielectric region.

5. The electrical circuit assembly of claim 1, comprising a second lateral-mode resonator fabricated upon the semiconductor integrated circuit and electrically coupled to the semiconductor integrated circuit, the second lateral-mode resonator having one or more lateral dimensions that are different from the first lateral-mode resonator.

6. The electrical circuit assembly of claim 1, comprising the first lateral-mode resonator being included in an array of lateral-mode resonators fabricated upon the semiconductor integrated circuit;
wherein at least some of the lateral-mode resonators are coupled to the semiconductor integrated circuit or to one another.

7. The electrical circuit assembly of claim 6, wherein the semiconductor integrated circuit includes a transistor-based switch circuit configured to establish a signal path including a selected one or more of the lateral-mode resonators included in the array.

8. The electrical circuit assembly of claim 6, wherein the semiconductor integrated circuit includes a transistor-based switch circuit configured to select amongst two or more filter circuits, the filter circuits including a specified one or more of the lateral-mode resonators included in the array.

9. The electrical circuit assembly of claim 1, comprising a second resonator having a structure and impedance different from the first lateral-mode resonator.

10. The electrical circuit assembly of claim 9, wherein the second resonator comprises a bulk acoustic wave resonator fabricated upon the semiconductor integrated circuit and electrically coupled to one or more of the first lateral-mode resonator or the semiconductor integrated circuit.

11. The electrical circuit assembly of claim 1, wherein the first lateral-mode resonator is electrically coupled to the semiconductor integrated circuit without requiring use of a wire bond; and
wherein the first lateral-mode resonator and semiconductor integrated circuit share a common semiconductor substrate.

12. The electrical circuit assembly of claim 11, wherein the first lateral-mode resonator is electrically-coupled to the semiconductor integrated circuit using a via structure included as a portion of the first lateral-mode resonator coupled to a pad on the semiconductor integrated circuit.

13. The electrical circuit assembly of claim 1, wherein the deposited piezoelectric layer comprises ZnO; and
wherein the semiconductor material of the deposited acoustic energy storage layer comprises one of a polycrystalline silicon layer or a silicon carbide layer.

14. The electrical circuit assembly of claim 1, wherein the semiconductor layer of the deposited acoustic energy storage layer comprises silicon carbide.

15. An electrical circuit assembly, comprising:
a semiconductor integrated circuit including complementary metal-oxide-semiconductor (CMOS) transistor structures; and
an array of lateral-mode resonators fabricated upon the semiconductor integrated circuit, including a first lateral-mode resonator fabricated upon a surface of the semiconductor integrated circuit, the first lateral-mode resonator comprising:
a deposited acoustic energy storage layer comprising a semiconductor layer;
a deposited piezoelectric layer acoustically coupled to the deposited acoustic energy storage layer;
a first conductive region electrically coupled to the deposited piezoelectric layer and electrically coupled to at least one of the transistor structures of the semiconductor integrated circuit; and
an acoustic mirror located between the deposited acoustic energy storage layer and the semiconductor integrated circuit.

16. The electrical circuit assembly of claim 15, comprising:
a dielectric region located upon a surface of the semiconductor integrated circuit, the dielectric region coupled to the deposited acoustic energy storage layer and defining a cavity between the deposited acoustic energy storage layer and the semiconductor integrated circuit;
wherein the acoustic energy storage layer includes a released configuration suspended from the dielectric region.

17. A method, comprising:
forming an acoustic energy storage layer upon a surface of a semiconductor integrated circuit using a low-temperature deposition technique, the low-temperature deposition technique including a maximum temperature specified not to disrupt operating characteristics of transistor structures included as a portion of the semiconductor integrated circuit;
forming a piezoelectric layer acoustically coupled to the deposited acoustic energy storage layer;
forming a first conductive region electrically coupled to the deposited piezoelectric layer and electrically coupled to the semiconductor integrated circuit;
wherein the acoustic energy storage layer, the piezoelectric layer, and the first conductive region are included as a portion of a first lateral-mode resonator;
wherein forming the acoustic energy storage layer comprises recrystallizing a deposited semiconductor material using a laser.

18. The method of claim 17, comprising forming an array of lateral-mode resonators upon the surface of the semiconductor integrated circuit, the array including the first lateral mode resonator; and
wherein the semiconductor integrated circuit includes complementary metal-oxide-semiconductor (CMOS) transistor structures.

19. The method of claim 17, comprising:
forming a dielectric region located upon a surface of the semiconductor integrated circuit, the dielectric region coupled to the deposited acoustic energy storage layer and defining a cavity between the deposited acoustic energy storage layer and the semiconductor integrated circuit;
wherein the acoustic energy storage layer includes a released configuration suspended from the dielectric region.

20. The method of claim 17, comprising:
forming an acoustic mirror located between the deposited acoustic energy storage layer and the semiconductor integrated circuit.

21. The method of claim 17, wherein a temperature used for forming the acoustic energy storage layer is less than about 450 degrees Celsius.

22. The method of claim 17, wherein a temperature used for forming the acoustic energy storage layer is less than about 400 degrees Celsius.

23. The method of claim 17, wherein the temperature used for forming the acoustic energy storage layer is no greater than 70 degrees Celsius.

* * * * *

UNITED STATES PATENT AND TRADEMARK OFFICE
CERTIFICATE OF CORRECTION

| | |
|---|---|
| PATENT NO. | : 10,122,345 B2 |
| APPLICATION NO. | : 14/392126 |
| DATED | : November 6, 2018 |
| INVENTOR(S) | : Edrees et al. |

Page 1 of 1

It is certified that error appears in the above-identified patent and that said Letters Patent is hereby corrected as shown below:

In the Specification

In Column 1, Line 2, after "RESONATORS", insert:
--GOVERNMENT SUPPORT CLAUSE
This invention was made with government support under 1343282 awarded by the National Science Foundation. The government has certain rights in the invention.--

Signed and Sealed this
Tenth Day of December, 2024

Katherine Kelly Vidal
*Director of the United States Patent and Trademark Office*